United States Patent
Shimizu et al.

(10) Patent No.: US 9,324,826 B2
(45) Date of Patent: Apr. 26, 2016

(54) SEMICONDUCTOR DEVICE AND MANUFACTURING METHOD OF THE SAME

(75) Inventors: Tatsuo Shimizu, Tokyo (JP); Takashi Shinohe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 924 days.

(21) Appl. No.: 13/216,413

(22) Filed: Aug. 24, 2011

(65) Prior Publication Data

US 2012/0199846 A1 Aug. 9, 2012

(30) Foreign Application Priority Data

Feb. 7, 2011 (JP) ................................. 2011-023599

(51) Int. Cl.
- *H01L 29/786* (2006.01)
- *H01L 29/66* (2006.01)
- *H01L 29/739* (2006.01)
- *H01L 29/78* (2006.01)
- *H01L 21/04* (2006.01)
- *H01L 29/16* (2006.01)
- *H01L 29/51* (2006.01)

(52) U.S. Cl.
CPC ...... *H01L 29/66068* (2013.01); *H01L 21/0465* (2013.01); *H01L 29/7395* (2013.01); *H01L 29/7802* (2013.01); *H01L 29/1608* (2013.01); *H01L 29/517* (2013.01)

(58) Field of Classification Search
CPC ..................... H01L 29/1608; H01L 21/02529; H01L 21/02378; H01L 21/02433
USPC .............. 257/77, 287, 471, 197, 330, E21.05, 257/E21.06
See application file for complete search history.

(56) References Cited

U.S. PATENT DOCUMENTS

| 2006/0046503 | A1 | 3/2006 | Sugawara et al. |
| 2010/0276700 | A1* | 11/2010 | Edmond et al. ................. 257/76 |
| 2013/0168699 | A1* | 7/2013 | Nakano et al. .................. 257/77 |

FOREIGN PATENT DOCUMENTS

| JP | 2008-147678 | 6/2006 |
| JP | 2008-182070 | 8/2008 |
| JP | 2010-41021 | 2/2010 |
| JP | 2012-074513 A | 4/2012 |

OTHER PUBLICATIONS

Office Action issued on Feb. 26, 2013 in the counterpart Japanese Patent Application No. 2011-023599 (with English Translation).
Office Action issued Aug. 20, 2013, in Japanese Patent Application No. 2011-023599 with English translation.
Dai Okamoto et al., "Improved Inversion Channel Mobility in 4H-SiC MOSFETs on Si Face Utilizing Phosphorus-Doped Gate Oxide", IEEE Electron Device Letters, vol. 31, No. 7, Jul. 2010, 3 Pages.

(Continued)

*Primary Examiner* — Cuong Q Nguyen
(74) *Attorney, Agent, or Firm* — Oblon, McClelland, Maier & Neustadt, L.L.P

(57) ABSTRACT

A semiconductor device of an embodiment at least includes: a SiC substrate; and a gate insulating film formed on the SiC substrate, wherein at an interface between the SiC substrate and the gate insulating film, some of elements of both of or one of Si and C in an outermost surface of the SiC substrate are replaced with at least one type of element selected from nitrogen, phosphorus, and arsenic.

17 Claims, 10 Drawing Sheets

(56) References Cited

OTHER PUBLICATIONS

Office Action issued in corresponding Japanese patent application No. 2013-240158 dated Sep. 2, 2014 (with English translation).

Office Action dated Jan. 6, 2015 issued in corresponding Japanese patent application No. 2013-240158 (with English translation).
U.S. Appl. No. 14/813,619, filed Jul. 30, 2015, Shimuzu.

* cited by examiner

SEMICONDUCTOR DEVICE AND MANUFACTURING METHOD OF THE SAME

CROSS-REFERENCE TO RELATED APPLICATION

This application is based upon and claims the benefit of priority from Japanese Patent Application No. 2011-023599, filed on Feb. 7, 2011; the entire contents of which are incorporated herein by reference.

FIELD

Embodiments described herein relate generally to a semiconductor device and manufacturing method of the same.

BACKGROUND

Conventionally, when an SiC substrate/$SiO_2$ insulating film interface in a MOSFET using a semiconductor SiC is generated, the surface of the semiconductor SiC substrate is hydrogen terminated, and the surface is oxidized, or an insulating film is deposited, so that the $SiO_2$ insulating film is formed. At this occasion, the hydrogen termination of the SiC substrate surface is easily detached, and oxygen enters into the inside of the substrate to oxidize the substrate.

The SiC substrate surface is considered to be oxidized as follows. Oxygen enters into the bond between Si—C in proximity to the surface, and this forms oxygen coordinated with the bond between the two. At this occasion, there are many bonds at the back side of elements of the outermost surface (which will be referred to as back bonds), and accordingly, oxygen randomly enters in proximity to the surface or in a depth direction, to make the interface rough as it is oxidized. As long as oxygen exists, this is inevitable, and the interface starts to become rough as soon as the $SiO_2$ insulating film is formed. Further, in the SiC substrate, carbon atoms are discharged as such forms as CO, so that the carbon atoms are diffused in the $SiO_2$ insulating film. As described above, when the oxidized film is formed directly on the hydrogen-terminated SiC substrate as in conventional techniques, the following three problems occur: (1) the surface is made into rough, (2) the interface dangling bond increases, and (3) diffusion of substrate constituting carbon into the insulating film. These three problems occur not only when $SiO_2$ film is formed but also when oxide insulating films (for example, $Al_2O_3$, $HfO_2$, HfAlO) and oxynitride insulating films (for example, AlON, HfSiON) are formed. This problem occurs when the hydrogen termination is detached from the SiC surface to activate the SiC surface, and oxygen reaches such activated SiC surface.

DETAILED DESCRIPTION

Figure 1:
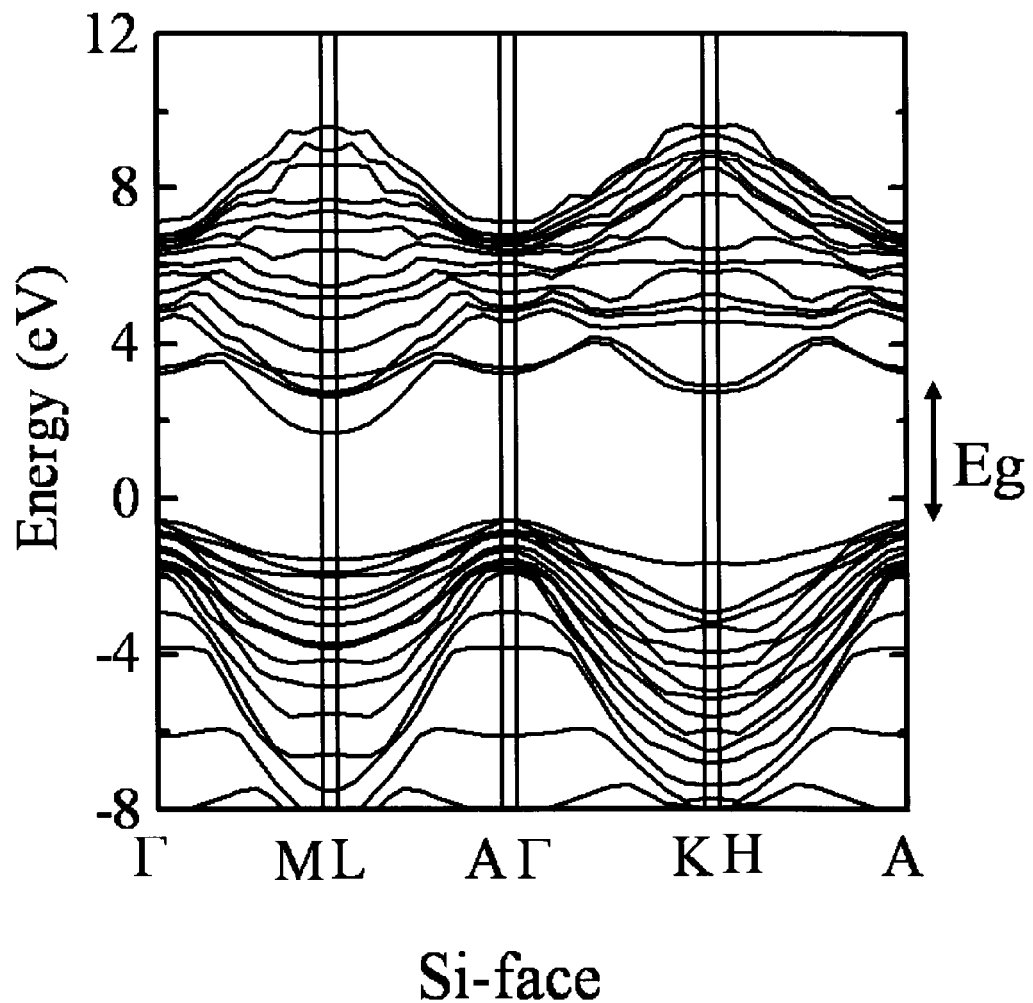
FIG. 1 is a band structure of Si plane made by nitrogen-terminating Si plane of a SiC substrate.

A semiconductor device of an embodiment at least includes: a SiC substrate; and a gate insulating film formed on the SiC substrate, wherein at an interface between the SiC substrate and the gate insulating film, some of elements of both of or one of Si and C in an outermost surface of the SiC substrate are replaced with at least one type of element selected from nitrogen, phosphorus, and arsenic.

Embodiments of the invention will be described below with reference to the drawings.

On (0001) plane, i.e., Si plane, of the SiC substrate, Si in the outermost surface is back-bonded with three Cs, and the surface has one dangling bond. Conventionally, the dangling bond is hydrogen-terminated by surface HF processing.

We have researched various combinations of termination materials and termination structures using a first principle calculation in order to find more stable surface structure than that of the conventionally used hydrogen termination. In this case, the first principle calculation is based on density functional formalism using local density approximation. Norm-conserving pseudopotential is used for Si. Ultrasoft pseudopotential developed by Vanderbilt is used for materials other than Si, such as C, N, P, As. On the back surface, a surface structure of Si plane is made as hydrogen termination structure, and the stable structure is sought by calculation. Likewise, (000-1) plane, i.e., C plane, is calculated, and (11-20) plane, i.e., A plane, is calculated. First, the termination structure of Si plane will be explained. Thereafter, the termination structures of C plane and A plane will be described. The C plane and the A plane will be mainly explained regarding the difference from the Si plane.

As a result of calculation on the Si plane, we have found that the extremely high stability can be obtained by replacing the outermost surface Si with N (nitrogen), P (phosphorus), or As (arsenic) instead of terminating the dangling bonds. When the outermost surface Si is replaced with the above elements, the three bonds of the replaced elements are respectively bonded with C which was bonded with the outermost surface Si, whereby a stable surface with low reactivity is made.

The reason why the surface is stabilized when the termination structure according to the embodiment is made is that the electrons in the dangling bonds drop to a valence band.

In the explanation below, nitrogen, phosphorus, or arsenic replacing Si will be referred to as a substitution element. Unless specifically stated otherwise, a combination of two kinds of elements or more is also considered as the substitution element. In addition, the termination structure according to the embodiment is a termination structure obtained by replacing the outermost surface Si atoms, and accordingly, referred to as outermost surface lattice point replacing type termination (which is abbreviated as replacing type termination).

Conventionally, on the Si plane, nitrogen is said to be physically adsorbed to a central position (which is referred to as H3 site) of the three outermost surface Sis. At this occasion, the bond direction of the dangling bond of the outermost surface Si is greatly distorted, and in fact, this is not so much stable. Moreover, it is known that this easily allows hopping with a barrier of about 1.0 eV between equivalent H3 sites. In other words, this physically adsorbed surface structure is unstable as a termination structure, and as long as there is oxygen, oxidization of the surface begins. In particular, the problem lies in a low surface coverage. Since the coverage is limited, some portions cannot be covered, which provides extremely weaker oxidization resistance than that of the replacing type termination according to the embodiment. The absorption energy of nitrogen to the H3 site is almost the same as the hydrogen termination, which is about several electron volts. In other words, this is a normal gain which is about the same as the hydrogen termination, and the coverage is smaller than the hydrogen termination. Therefore, overall oxidization resistance is lower than that of the hydrogen termination.

Since the substitution element is bonded with the substrate with three bonds, the replacing type termination according to the embodiment is extremely stable as compared with the conventional hydrogen termination (in the hydrogen termination, the element is bonded with only one bonding). Therefore, the substitution element does not hop and move around the surface. Moreover, as compared with the H3 position, the N is bonded with a three times larger surface density, which makes stronger termination on the Si plane. As compared with the hydrogen termination, the bonding is several times larger while the coverage is about the same. In order to make this structure, it is necessary to react the outermost surface Si and the substitution element with each other to replace the Si. However, when the Si is replaced, a higher stability is achieved in terms of energy, and therefore, once the replacement is completed, this structure is extremely stable.

Figure 2:
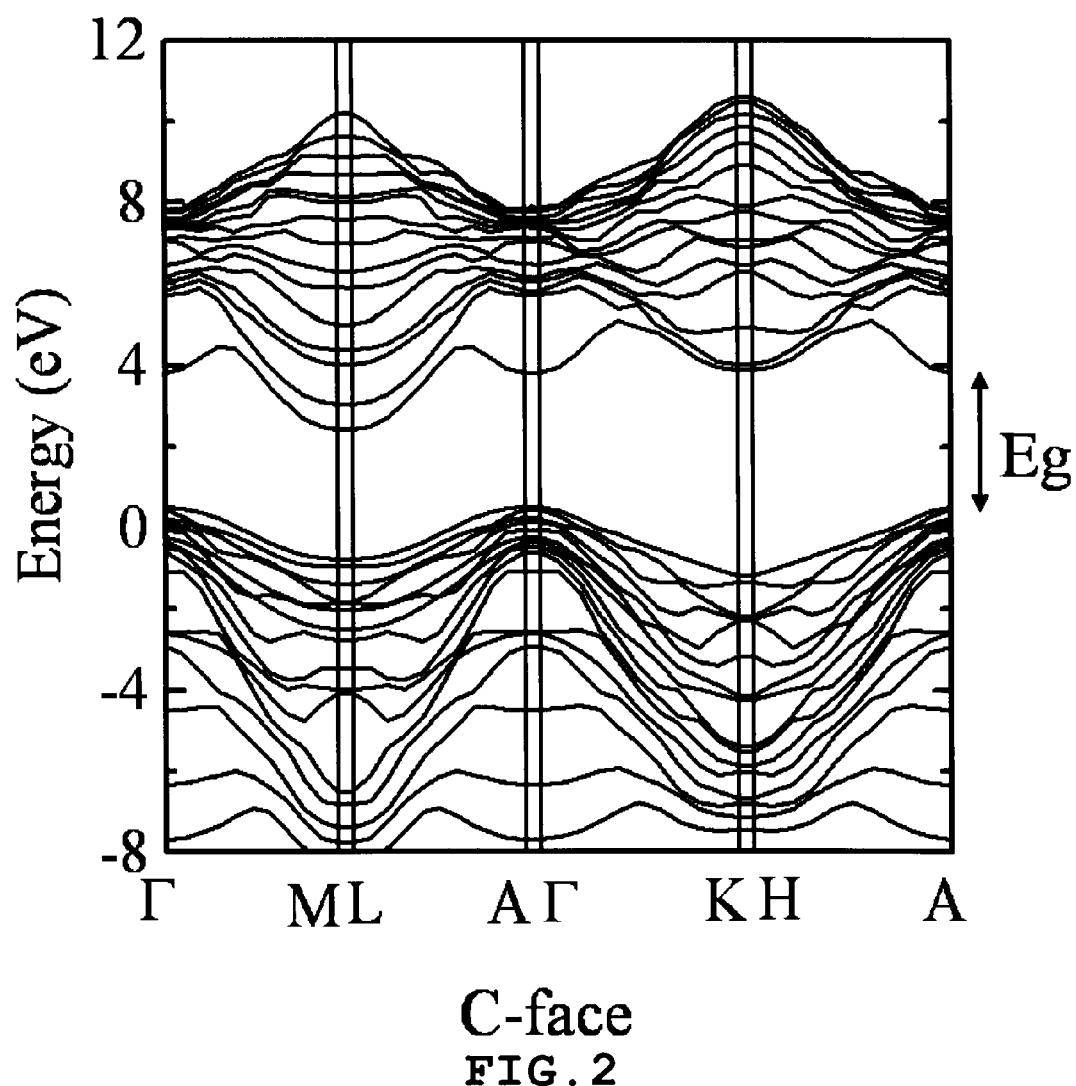
FIG. 2 is a band structure of C plane made by nitrogen-terminating C plane of the SiC substrate.

FIG. 1 illustrates a band structure of nitrogen-terminated Si plane. Likewise, FIG. 2 is a band structure of nitrogen-terminated C plane. According to the calculation, the binding energy is 7 eV or more, and it is understood that the once completed replacing type termination is extremely stable. The binding energy of hydrogen-terminated Si—H is several electron volts, and the binding energy is extremely lower than the replacing type termination according to the embodiment. A band structure terminated by another substitution element and a band structure of A plane terminated by a substitution element, which are not shown, also have high binding energy, and therefore, the replacing type termination is extremely stable.

In the replacing type termination according to the embodiment, the surface is densely covered, and the dangling bond is reduced. Therefore, the reactivity in the surface is extremely low. Therefore, substrate and oxygen hardly react with each other even when oxygen is present in proximity to the SiC substrate in a process that involves making the temperature around the substrate high (for example, a high temperature process at 1050° C. for the baking a gate oxidized film of MOSFET of SiC or an annealing process at 1600° C. for activating dopants in a source region or the like) after the termination. On the hydrogen terminated substrate, all the hydrogen terminations are detached even in the annealing process at about 800° C. Therefore, the substrate is oxidized in the semiconductor manufacturing process after the hydrogen termination. As described above, this replacing type termination according to the embodiment is extremely stable, and thereby can avoid roughening of the surface (interface) caused by oxygen. Moreover, since no oxygen enters into the SiC substrate, carbon atoms in the substrate would not diffuse into the gate insulating film, and interdiffusion between the substrate SiC and the gate insulating film $SiO_2$ does not occur.

The calculation indicates that the dangling bond can be eliminated in the gap in the replacing type termination according to the embodiment. In other words, for example, this can eliminate diffusion source, which makes fixed charges and reduces the mobility of electrons (or holes) passing through the channel of MOSFET.

Figure 3:
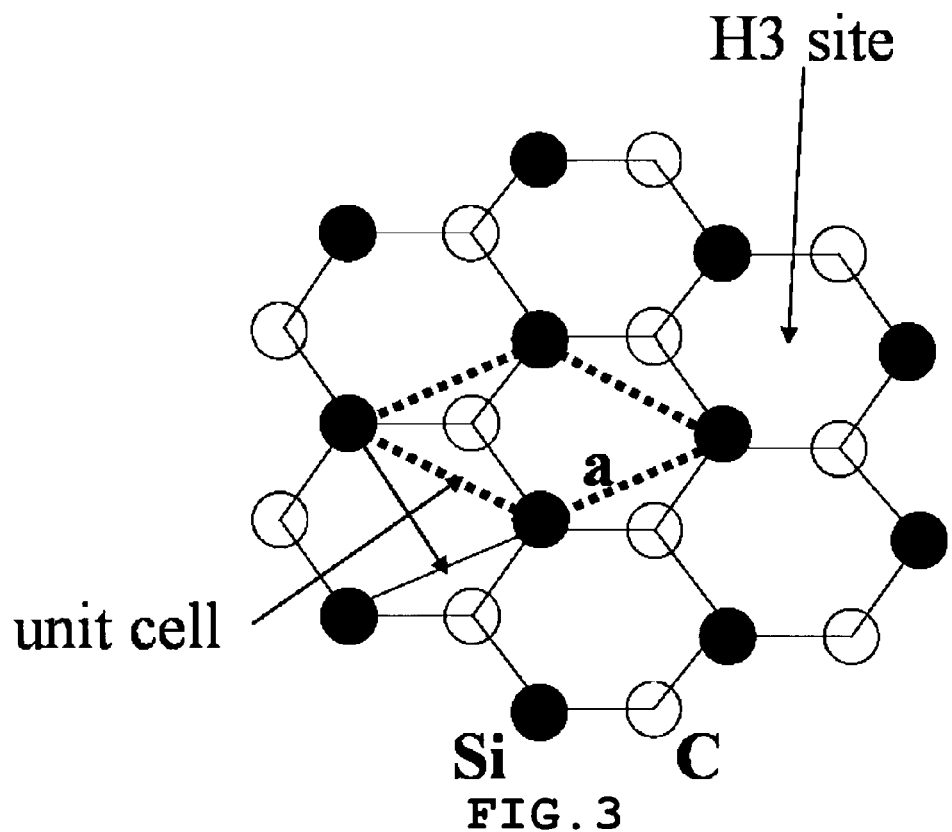
FIG. 3 is a structure formula of Si plane of the SiC substrate.

Like the structure formula as shown in FIG. 3, the Si plane of SiC has Sis (black circles) arranged in the outermost surface and has Cs (white circles) arranged in the surface immediately under the outermost surface. When the Sis in the outermost surface are replaced with the substitution elements, the replacing type termination according to the embodiment is obtained. The surface density of the nitrogen at this moment is obtained as follows: 1 atom/the size of area of unit cell=1/(lattice constant a×lattice constant a×$\sqrt{3}$/2)=$1.22\times10^{15}$/cm$^2$.

The replacing type termination according to the embodiment is stable and effective. Therefore, when about 10% of the Si plane (surface density $0.122\times10^{15}$/cm$^2$) is made into the replacing type termination, the replacing type termination according to the embodiment is sufficiently effective in reducing the oxidization and reducing the interdiffusion. Therefore, a structure is preferable in which 10% or more of Si in the outermost surface is replaced with the substitution elements. It is known that when 40% or more (surface density $0.488\times10^{15}$/cm$^2$) is replaced with the substitution elements, almost the same effects as those obtained when 100% is replaced (this is the most preferable) can be obtained, which is furthermore preferable. When the termination processing is performed at a high temperature and a high substitution element (an element selected from N, P, As) partial pressure, the substitution elements selected from N, P, As can be trapped between the outermost surface Si layer and the C layer under the outermost surface Si layer. In this case, two elements (elements selected from N, P, As) can be trapped in a combination of Si—C—Si—C. With this trapping, the surface density of the trapped substitution elements attains $1.22\times10^{15}$/cm$^2$. In other words, with the replacing and trapping of elements, the elements may be introduced until the surface density reaches $2.44\times10^{15}$/cm$^2$. In this substitution element trap structure, the substitution element is coordinated with three bonds, which is stable. Therefore, this can also be understood as a structure for strengthening the replacing type termination. Therefore, the surface density of the substitution elements is preferably between $0.122\times10^{15}$/cm$^2$ and $2.44\times10^{15}$/cm$^2$ inclusive, and is more preferably between $0.488\times10^{15}$/cm$^2$ and $1.22\times10^{15}$/cm$^2$ inclusive.

The substitution elements according to the present embodiments exists just on the interface of $SiO_2$/SiC substrate. Both of the number of the substitution elements at the side of $SiO_2$ and the number of the substitution elements at the side of the SiC substrate are required to be greatly small. This is because when there are substitution elements at the side of $SiO_2$, a trap is formed there. When there are many substitution elements at the side of SiC as described above, they are made into N type, which makes a normally-ON MOS interface. Not only at the side of $SiO_2$ but also at the side of SiC substrate, it is desired to have the surface density equal to or less than $1.0 \times 10^{12}/cm^2$ so as not to affect the channel.

The surface density of the substitution element in the thickness direction of the interface has a peak at the interface position, and the half-value width of distribution in the film thickness direction at the peak is 1 nm or less. More preferably, it is 0.25 nm or less. When the peak is just on the interface, the half-value width is 0.05 nm or more. Therefore, the half-value width is between 0.05 nm and 1.0 nm inclusive. More preferably, the half-value width is between 0.05 nm and 0.25 nm inclusive.

An additional advantage caused by the replacing type termination according to the embodiment is that "steps" and "roughness" on the substrate surface are etched, and more planar terrace structure than that before the processing can also be made. In other words, the interface can be changed into a more planar structure. In the conventional hydrogen termination, since the hydrogen termination is detached, the surface becomes rougher. Therefore, the surface treatment is substantially meaningless. However, in the method of the embodiment, the surface is not made rough in the process of forming the insulating film. Therefore, the initial process for planarizing the surface is reflected in the planarization of the final substrate/gate insulating film interface. The planarization is extremely effective in preventing scattering of electrons passing through the channel.

When starting from the conventional hydrogen termination, and $SiO_2$ is formed by thermal oxidation, the mobility is about 100 $cm^2/Vs$ immediately after the film is formed. However, the mobility obtained after processes including the electrode forming process and the hydrogen annealing process drops to about 10 $cm^2/Vs$. When the annealing process with NO, $POCl_3$, and the like is performed after the electrode forming process, the mobility is improved and the characteristics can be improved to 40 $cm^2/Vs$, 89 $cm^2/Vs$.

Figure 4:
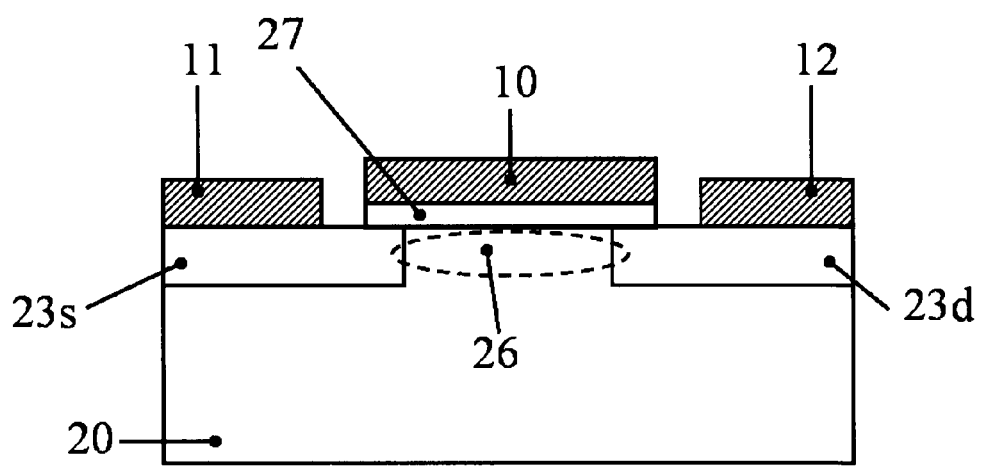
FIG. 4 is a conceptual diagram of a lateral n-MOSFET.

In contrast, as shown in FIG. 4, a lateral N-MOSFET structure (in FIG. 4, s, d denote source, drain, respectively) was made, and the mobility was measured. According to the method of the embodiment, the SiC substrate is terminated with the substitution elements, and thereafter $SiO_2$ is deposited by CVD. Then, Ni is deposited. After NiSi salicide process, the mobility can be improved to 200 $cm^2/Vs$ or more with any of nitrogen, phosphorus, arsenic termination. In this case, the temperature is set to 20° C., the plasma-excited N atom (this is also applicable when it is plasma-excited P atom or plasma-excited As atom) partial pressure is set to 1.0 Torr (1 Torr=101325 Pa/760=133.3223684 Pa), and the surface treatment time is set to 60 seconds. Ne is introduced, so that the total pressure is 10 Torr. When Si plane is used, phosphorus termination is most preferable, in which the mobility reaches as much as 250 $cm^2/Vs$. This is considered to be because the interface is not made rough, and the carbon-derived fixed charges are not generated in the gate insulating film.

Further, when an idea of planarizing the SiC substrate surface is employed, the mobility can be improved to 300 $cm^2/Vs$ or more. The temperature, the processing time, and the total pressure are effective for the planarization. The temperature is set to 100° C., the plasma-excited N atom (this is also applicable when it is plasma-excited P atom or plasma-excited As atom) partial pressure is set to 1.0 Torr, and the surface treatment time is extended to 300 seconds. Much Ne is introduced, so that the total pressure is 20 Torr.

In the replacing type termination according to the embodiment, a stable interface with the insulating film can be formed. That can suppress diffusion of C from the SiC substrate into the insulating film, and therefore, the C concentration in the insulating film can be set to 0.5 at % or less.

In order to achieve the replacing type termination according to the embodiment, it is necessary to apply large energy to the substitution element to prevent the substitution elements from rapidly reaching the SiC surface and, at the same time, to prevent the substitution elements from entering the SiC substrate. This time, we could understand the stable termination structure in a micro level. Therefore, we have found an improved process for achieving the replacing type termination structure according to the embodiment.

In order to apply large energy to the substitution element, it is effective to introduce N, P, As, and the like in an excited state. For example, the termination processing is performed in an atmosphere containing a gas obtained by exciting at least one type of compound selected from the compounds which do not contain oxygen, such as N, $N_2$, $HN_3$, $NF_3$, $NCl_3$, P, $P_2$, $PH_3$, $PF_3$, $PCl_3$, As, $As_2$, $AsH_3$, $AsF_3$, $AsCl_3$. At this occasion, in particular, the amount of content of oxygen atoms in oxygen, water, and the like needs to be reduced as much as possible, and accordingly, a gas obtained by exciting a compound not containing oxygen but containing the substitution element is used as the excitation gas. When these excitation gases are used, the replacing type termination structure coordinated with three bonds according to the embodiment can be obtained. When oxygen is added, oxidization starts in advance. As a result, the oxidized surface cannot be made into the termination structure according to the embodiment. When poorly made source gas is used, oxygen atoms may be contained in the processing atmosphere. It is important to use a source gas refined with high precision to make the oxygen concentration 0.001 ppm or less in the atmosphere in which termination is processed. The compounds used in introduction of nitrogen with NO and $N_2O$ and introduction of with $POCL_3$, which are often used in the termination processing, contain oxygen, and therefore, they cannot be used in the termination processing. It should be noted that the means for excitation is not particularly limited. Typically, the excitation can be made by making a plasma state by applying an electric field. Further, a method for achieving the high energy excited state by high-speed collision with W electrode at a high temperature is also effective.

In this case, it is possible to mix a substance for terminating one dangling bond of the outermost surface Si such as H, F, Cl into the excited gas to make $NH_3$, $NF_3$, and $NCl_3$. This is because the replacing type termination according to the embodiment is more stable than the termination structure made of these compounds, and even when the H termination or the like is made, the flow proceeds to the replacing type termination according to the embodiment.

It is important to reduce a mean distance (mean free path) in which the above-described excited nitrogen and the like can move, in relation to preventing the substitution elements from rapidly reaching the SiC surface and also preventing the substitution elements from entering the SiC substrate. It is also important to reduce the temperature as much as possible, and to dilute with inactive gases such as Ar, He, Ne, Kr, Xe, and the like. Basically, the surface treatment at the lowest possible temperature and at the lowest possible atmosphere is the best. When they are high, nitrogen enters the surface and the nitriding process starts in proximity to the surface. When diluted with He or the like, activity of exciting N and the like is preserved, but the mobility thereof is somewhat limited. Further, He or the like covers the H3 site, i.e., a vacant space in the surface, and therefore, it has an effect of preventing the nitrogen atom and the like from entering from the H3 site into the deeper side.

More specifically, this can be achieved when the temperature is set between 0° C. and 200° C. inclusive, the excitation replacing gas partial pressure is set between 0.1 Torr and 2.0 Torr inclusive, the total pressure is set between 2.0 Torr and 20 Torr inclusive, and the surface treatment time is set between 10 seconds and 600 seconds inclusive. The excitation replacing gas partial pressure is preferably lower, and sufficient amount of dilution gas such as He preferably exists. Therefore, the excitation replacing gas partial pressure/(dilution gas partial pressure+excitation replacing gas partial pressure) is preferably between 0.005 and 0.1 inclusive.

More specifically, the temperature is 20° C., the plasma-excited N atom partial pressure is 1.0 Torr, Ne is introduced so that the total pressure is 10 Torr, and the surface treatment time is 60 seconds. At this occasion, the excitation N partial pressure/(dilution gas partial pressure+excitation N partial pressure) is equal to 0.1.

Further, when the termination processing is performed under the above conditions at a high temperature with high excitation replacing gas partial pressure for a long processing time, not only the termination processing according to the embodiment is performed but also the processing surface can be planarized.

The surface planarization can be achieved when the temperature is set between 100° C. and 200° C. inclusive, and also according to the above description, the excitation replacing gas partial pressure is set between 0.1 Torr and 2.0 Torr inclusive, the total pressure is set between 10 Torr and 20 Torr inclusive, and the surface treatment time is set between 200 seconds and 600 seconds inclusive. The total pressure is preferably higher, and the sufficient amount of dilution gas such as He preferably exists. Therefore, the excitation replacing gas partial pressure/(dilution gas partial pressure+excitation replacing gas partial pressure) is preferably between 0.005 and 0.1 inclusive.

By performing the termination processing under the above conditions, the surface density of the substitution elements trapped between Si—C—Si—C lattice in a layer below the outermost surface of the SiC substrate can be increased.

The temperature, the processing time, and the total pressure are effective for the planarization. More specifically, the temperature is 100° C., the plasma-excited N atom partial pressure is 1.0 Torr, and the surface treatment time is 300 seconds. Much Ne is introduced, so that the total pressure is 20 Torr. At this occasion, the excitation N partial pressure/(dilution gas partial pressure+excitation N partial pressure) is 0.05.

It should be noted that it may be possible to manually set processing relating to the replacing type termination according to the embodiment, or an automating system may be incorporated into a semiconductor manufacturing device.

At this occasion, with regard to the Si plane, the order of stability of nitrogen, phosphorus, arsenic termination is sought by calculation. As a result, the order was found to be P, N, As. For the Si plane, the P termination is the best, the N termination is the second best, and the As terminations is the third best.

In the explanation above, the SiC substrate and the Si plane are considered. The above description can also be applied to the C plane. A major difference lies in that the outermost surface element, C, on the C plane is replaced with the substitution element and made into the replacing type termination, whereby more stable replacing type termination than the Si plane can be formed. The replacing type termination on the C plane is also coupled with the substrate with three bonds, which is extremely stable. The binding energy is 12 eV or more, and it is understood that the once completed replacing type termination is extremely stable. The remaining features other than the above are the same. With regard to the C plane, the order of stability of nitrogen, phosphorus, arsenic termination is sought by calculation. As a result, the order was found to be N, P, As. For the C plane, the N termination is the best, the P termination is the second best, and the As terminations is the third best.

The above description can also be applied to the A plane. A major difference lies in that both of Si and C exist in the outermost surface. This structure is the same in coupling with the substrate with three bonds, and therefore, the replacing type termination of the A plane is also extremely stable. The binding energy is 10 eV or more, and it is understood that the once completed replacing type termination is extremely stable. The remaining features other than the above are the same. With regard to the A plane, the order of stability of nitrogen, phosphorus, arsenic termination is sought by calculation. As a result, the order was found to be N, P, As. However, the N termination is almost equivalent to the P termination. When this is examined in more detail, it is understood that the following case is the most stable: Si is replaced with P, and C is replaced with N. In other words, the same amounts of N and P are supplied, so that the most stable termination structure is formed. Thus, the preferable ratio of A plane between the amount of N and the amount of P is 1:1. Since this state is the most stable, if the surface treatment is performed by introducing the same amounts of excitation N and excitation P, the ratio between the amount of N and the amount of P may be 1:1 and the surface-terminated structure may be formed.

The semiconductor device according to the embodiment will be described below in a more specific manner using examples.

In the embodiments, MOSFET and IGBT having the following features will be described as examples.

A semiconductor device according to an embodiment is characterized by including a SiC substrate including an N type or P type semiconductor substrate and an N type first semiconductor layer formed on the semiconductor substrate, a P type first semiconductor region formed in the SiC substrate surface, an N type second semiconductor region formed so as to be exposed on the SiC substrate surface in the first semiconductor region, a P type third semiconductor region formed so as to be exposed on the SiC substrate surface in the first semiconductor region, a gate insulating film formed so as to extend on the second semiconductor region at the side of the SiC substrate surface in the first semiconductor region and the first semiconductor layer and an N type fourth semiconductor region formed to be exposed on the SiC substrate surface in the first semiconductor region, a first electrode formed on the gate insulating film, a second electrode in ohmic contact with the second semiconductor region and the third semiconductor region, and a third electrode formed on a surface at the side of the semiconductor substrate (back surface) of the SiC substrate, wherein at an interface between the SiC substrate and the gate insulating film, some of elements of both of or one of Si and C in an outermost surface of the SiC substrate are replaced with at least one type of element selected from nitrogen, phosphorus, and arsenic.

When the above semiconductor device is a MOSFET, the first electrode is a gate electrode, the second electrode is a source electrode, and the third electrode is a drain electrode.

When the above semiconductor device is an IGBT, the first electrode is a gate electrode, the second electrode is an emitter electrode, and the third electrode is a collector electrode.

Further, the method for manufacturing the semiconductor device according to the embodiment has the following features.

A method for manufacturing a semiconductor device is characterized in that the SiC substrate is processed in an atmosphere containing a gas obtained by exciting a compound containing one or more types of elements selected from nitrogen, phosphorus, and arsenic, a gate insulating film is formed on a surface of the processed SiC substrate, an oxygen concentration in the atmosphere is 0.001 ppm or less, a total pressure of the atmosphere is between 2.0 Torr and 20 Torr inclusive, and in the atmosphere, a partial pressure of the excitation gas is between $1/200$ and $1/10$ of the total pressure, and a temperature of the processing is between 0° C. and 200° C. inclusive.

First Embodiment

Figure 5:
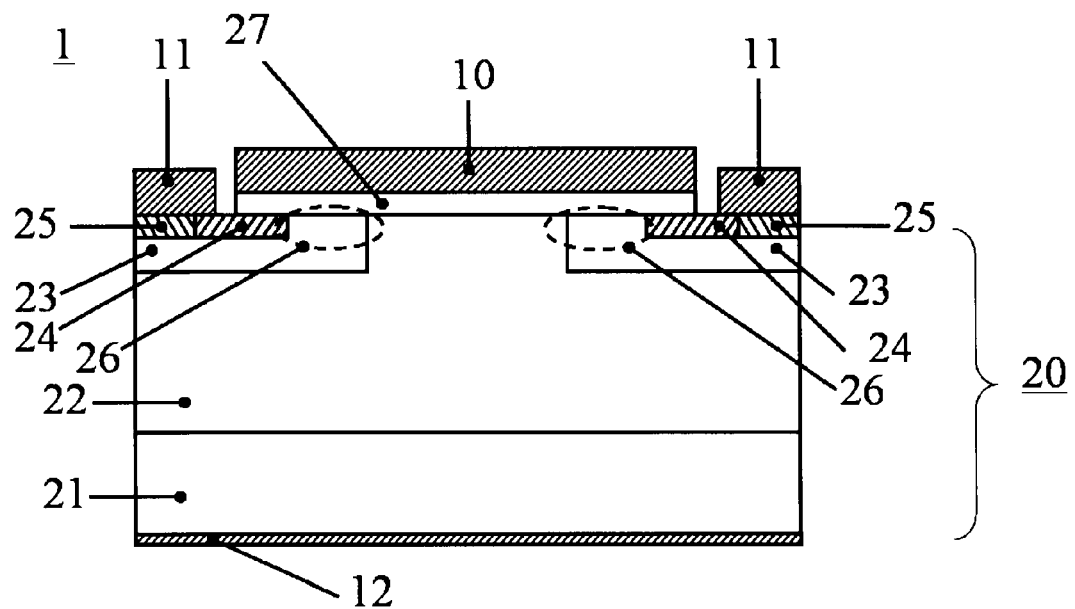
FIG. 5 is a conceptual diagram illustrating a semiconductor device according to a first embodiment.

FIG. 5 is a cross sectional conceptual diagram illustrating a high-breakdown voltage semiconductor device according to the first embodiment of the present invention. As shown in FIG. 5, a semiconductor device 1 according to the present invention is a longitudinal DiMOSFET (DoubleImplanted Metal-Oxide-Semiconductor Field-effect Transistor), and includes an N type substrate 21, an N type first semiconductor layer 22, P type first semiconductor regions 23, an N type second semiconductor region 24, P type third semiconductor regions 25, a P type channel region 26, an oxidized film 27, a source electrode 11, a gate electrode 10, and a drain electrode 12 formed at the back surface side of the substrate 21.

More specifically, the N type first semiconductor layer 22 serving as an N-epitaxial layer is formed on the surface of the N type substrate 21 made of silicon carbide (SiC) whose conductivity type is N. The N type first semiconductor layer 22 is made of silicon carbide whose conductivity type is N, and for example, the thickness thereof is 10 µm. The concentration of nitrogen serving as N type conductive impurity in the N type first semiconductor layer 22 serving as a SiC epitaxial growth layer can be $5\times10^{15}/cm^3$.

On the surface layer of this N type first semiconductor layer 22, the first semiconductor regions 23 having the conductivity type of P are formed away from each other. In the first semiconductor region 23, N+ type second semiconductor region 24 is formed on the surface layer of the first semiconductor region 23. Further, at a position adjacent to the second semiconductor region 24, the P+ type third semiconductor region 25 is formed. A portion 26 extending from the second semiconductor region 24 to the first semiconductor layer 22 is a channel in which current is turned ON/OFF according to voltage application to the gate electrode 10.

The gate insulating film 27 serving as the insulating film is formed to extend on one of the second semiconductor regions 24, the first semiconductor region 23, the first semiconductor layer 22 exposed between the two first semiconductor regions 23, the other of the first semiconductor regions 23, and the other of the second semiconductor regions 24. The gate insulating film 27 is not formed on the third semiconductor regions 25.

The replacing type termination processing according to the embodiment is performed on the surface of the first semiconductor regions 23 before the gate insulating film 27 is formed, so that the characteristics of the semiconductor device are improved.

On the gate insulating film 27, the gate electrode 10 is formed. On the second semiconductor region 24 and the third semiconductor region 25, the source electrode 11 is formed. Further, the drain electrode 12 is formed on the back surface of the N type substrate 21.

FIGS. 6 to 9 illustrate detailed conceptual diagrams of generation process.

First, hexagonal SiC substrate (4H—SiC substrate) on (0001) plane (Si plane) is prepared as the substrate 21. For example, the substrate whose conductivity type impurity concentration $6\times10^{17}/cm^3$ is prepared.

Figure 6:
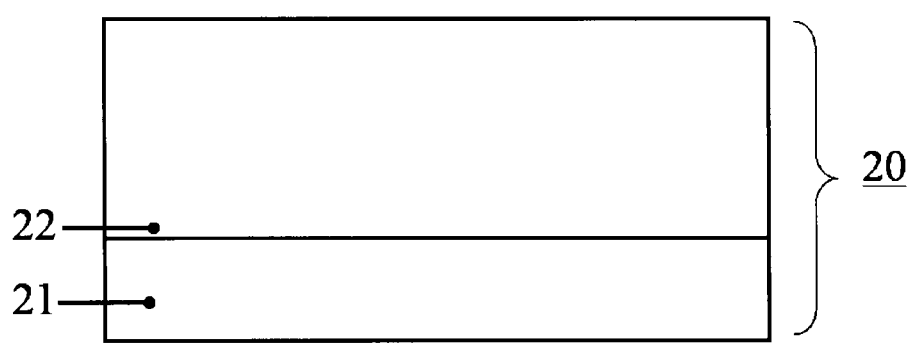
FIG. 6 is a conceptual diagram illustrating a manufacturing process of the semiconductor device according to the first embodiment.

Subsequently, the N type first semiconductor layer 22 is formed on the N type substrate 21. As this N type first semiconductor layer 22, a layer made of an N type conductivity type silicon carbide is formed by the epitaxial growth method. In this epitaxial layer forming step, for example, $SiH_4$ gas and $C_3H_8$ gas can be used as the source gas. In this manner, the structure as shown in the conceptual diagram of FIG. 6 is obtained.

The thickness of this N type first semiconductor layer 22 is, for example, 10 µm. The concentration of the N type conductive impurity in this N type first semiconductor layer 22 is, for example, $5\times10^{15}/cm^3$. The thickness of the N type first semiconductor layer 22 is between 0.5 µm and 20 µm inclusive.

Subsequently, an ion injection step is carried out. More specifically, by using, as a mask, an oxidized film formed by using photolithography and etching, the impurity whose conductivity type is P type is injected into the first semiconductor layer 22 and the first semiconductor regions 23 are formed. After the used oxidized film is removed, an oxidized film having a new pattern is formed again using photolithography and etching. Then, as shown in the conceptual diagram of FIG. 7, by using the oxidized film as a mask, N type conductive impurity is injected into predetermined regions and the second semiconductor region 24 is formed. By using the same method, the impurity whose conductivity type is P type is injected and the third semiconductor regions 25 are formed.

The concentration of the conductive impurity in the first semiconductor region 23 is, for example, $1\times10^{16}/cm^3$. The conditions of Al ion injection may be, for example, $1\times10^{15}/cm^2$, 80 keV. In this case, the substrate is heated to 300° C. The concentration of the conductive impurity in the first semiconductor region 23 may be between $1\times10^{13}/cm^3$ and $5\times10^{17}/cm^3$ inclusive. More preferably, it may be between $1\times10^{15}/cm^3$ and $5\times10^{16}/cm^3$ inclusive. Since the channel region 26 is included, a threshold value is required to be stabilized, and the mobility is required to be increased. Therefore, doping is not performed with very high concentration.

Further, the concentration of the conductive impurity in the second semiconductor region 24 may be, for example, $5\times10^{16}/cm^3$. The conditions of N ion injection may be, for example, $1\times10^{15}/cm^2$, 40 keV. In this case, the substrate is heated to 300° C. The concentration of the conductive impurity in the second semiconductor region 24 is between $1\times10^{14}/cm^3$ and $1\times10^{18}/cm^3$ inclusive. More preferably, it is between $5\times10^{15}/cm^3$ and $5\times10^{17}/cm^3$ inclusive.

Likewise, the concentration of the conductive impurity in the third semiconductor region 25 may be, for example, $5\times10^{16}/cm^3$. The conditions of Al ion injection may be, for example, $1\times10^{15}/cm^2$, 40 keV. In this case, the substrate is heated to 300° C. The concentration of the conductive impurity in the third semiconductor region 25 may be between $1\times10^{14}/cm^3$ and $1\times10^{18}/cm^3$ inclusive. More preferably, it may be between $5\times10^{15}/cm^3$ and $5\times10^{17}/cm^3$ inclusive.

Figure 7:
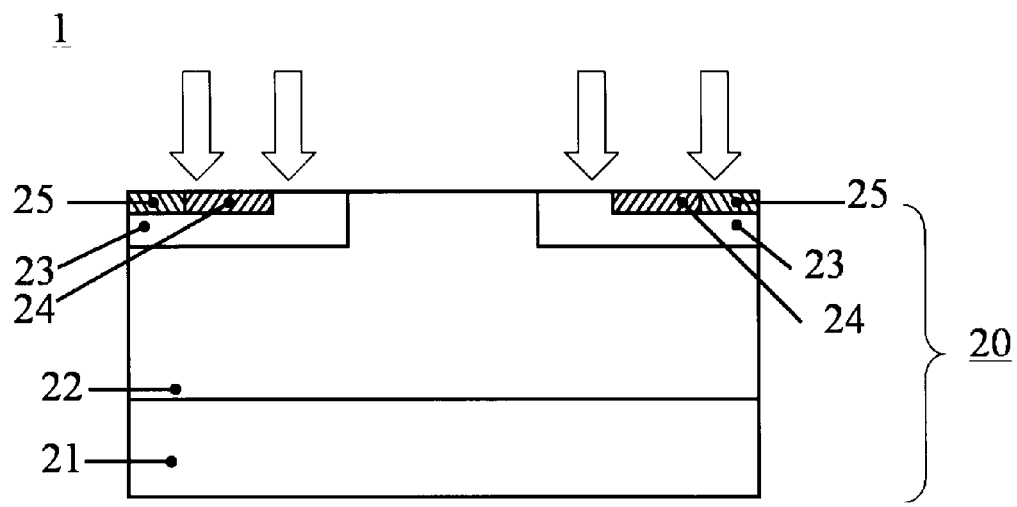
FIG. 7 is a conceptual diagram illustrating the manufacturing process of the semiconductor device according to the first embodiment.

After the injection step, activating annealing processing is performed. In this activating annealing processing, for example, the following conditions may be used: an argon gas is used as an atmosphere gas, the heating temperature is set to 1600° C., and the heating time is 30 minutes. In this manner, the structure as shown in FIG. 7 is obtained. At this occasion, the dopant introduced into the SiC can be activated but is hardly diffused.

Subsequently, surface treatment of the SiC substrate 20 is performed. The surface referred to herein means a surface of the SiC substrate 20 formed with the P-region 23, i.e., a surface on which the gate insulating film 27 is deposited later. More specifically, the surface treatment was carried out under the following conditions: the temperature was set to 20° C., the plasma-excited N atom partial pressure was set at 1.0 Torr, Ne was introduced so that the total pressure was 10 Torr, and the surface treatment time was 60 seconds. At this occasion, the excitation N partial pressure/(dilution gas partial pressure+excitation N partial pressure) is equal to 0.1.

Figure 8:
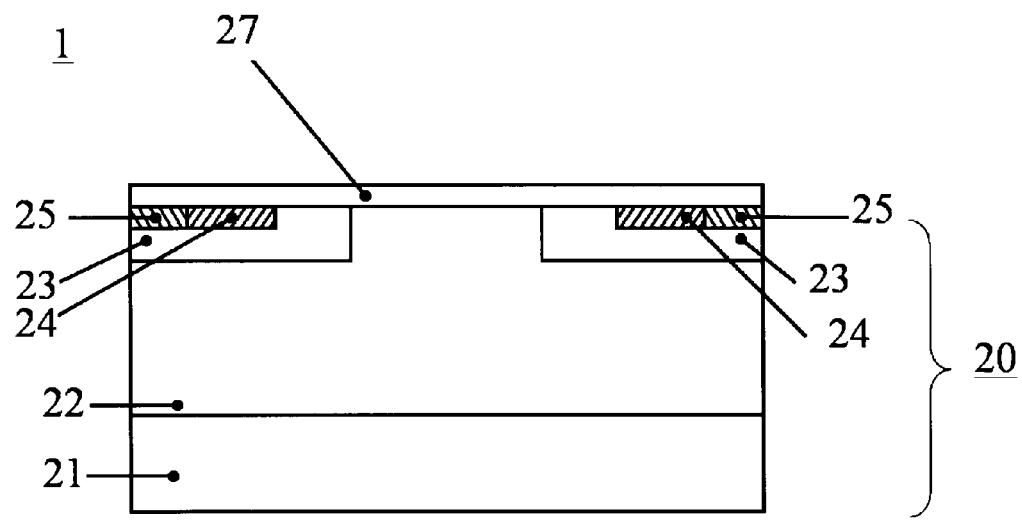
FIG. 8 is a conceptual diagram illustrating the manufacturing process of the semiconductor device according to the first embodiment.

After this surface treatment was completed, the gate insulating film forming step was performed. More specifically, the gate insulating film 27 was formed so as to cover all of the first semiconductor layer 22, the first semiconductor regions 23, the second semiconductor regions 24, and the third semiconductor regions 25. In order to form this gate insulating film 27, evaporation was performed with, for example, an electron beam. In addition, various other methods such as CVD method and sputter method may be employed. Alternatively, the oxidized film may be a high dielectric film (such as $Al_2O_3$, $HfO_2$, HfON, HfSiON). Further, a laminated film including the $SiO_2$ film and the high dielectric film is also effective. Subsequently, the oxidized film is refined under the conditions of 1050° C., $N_2$/Ar, heating time of 1 minute. Thus, the structure as shown in the conceptual diagram of FIG. 8 is obtained.

Subsequently, the electrode forming step is carried out. More specifically, using a photolithographic method, a resist film having a pattern is formed on the gate insulating film 27. Using the resist film as a mask, portions of the gate insulating film 27 located on the second semiconductor regions 24 and the P+ regions 25 are removed by etching. Thereafter, a conductive film made of metal or the like is formed in opening portions formed on the resist film and the gate insulating film 27 so that it is in ohmic contact with the second semiconductor regions 24 and the third semiconductor regions 25. Thereafter, the resist film is removed, so that the conductive film located on the resist film is removed (lift off).

Figure 9:
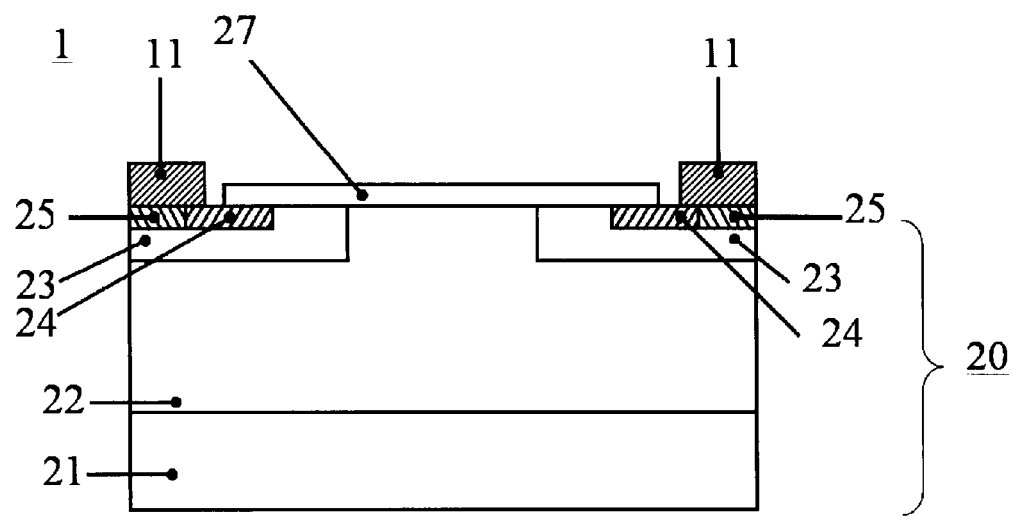
FIG. 9 is a conceptual diagram illustrating the manufacturing process of the semiconductor device according to the first embodiment.
Figure 10:
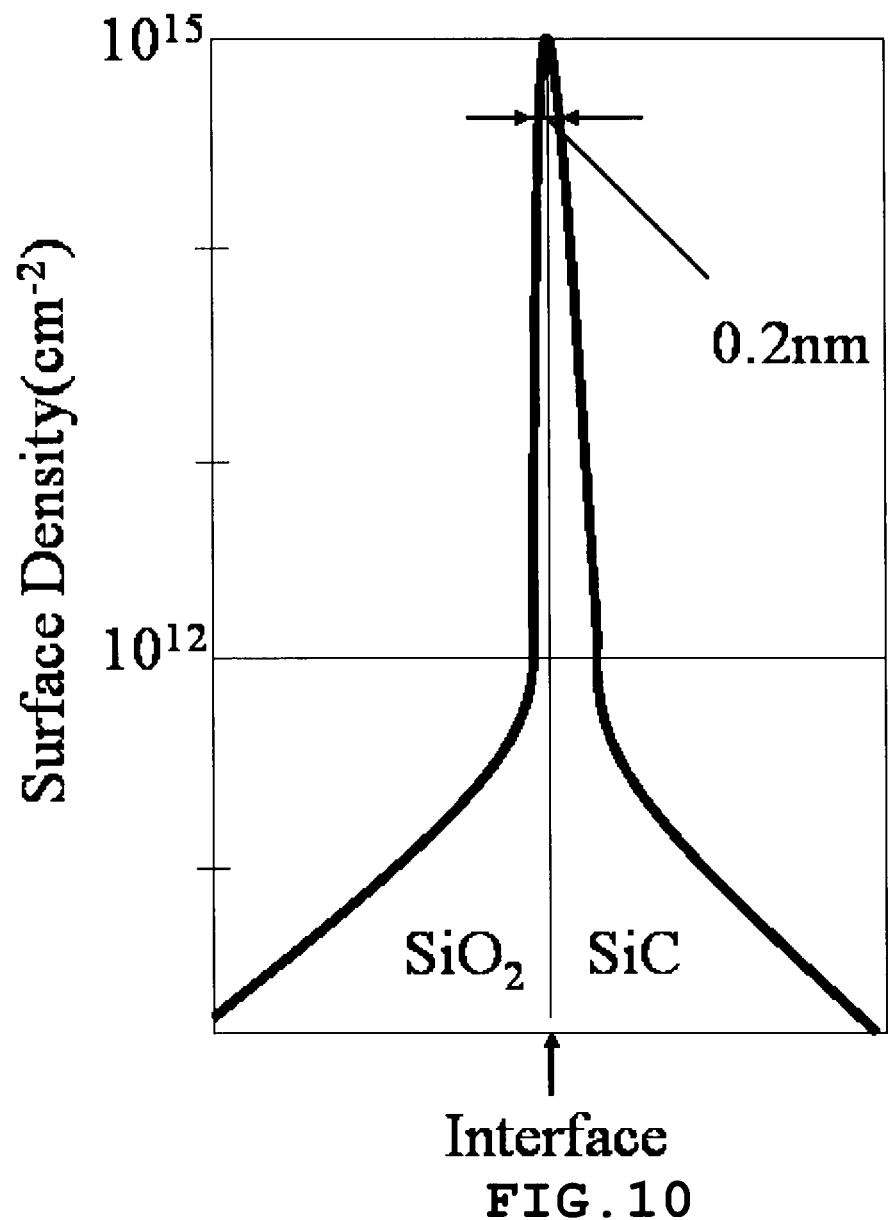
FIG. 10 is a diagram illustrating relationship between surface density and interface according to the first embodiment.

In this case, NiSi may be used as a conductive material. As a result, as shown in FIG. 9, the source electrode 11 can be obtained.

Thereafter, the gate electrode 10 is formed on the gate insulating film 27 serving as the gate insulating film. For example, it may be N type polysilicon and the like. The source electrode may also be N type polysilicon, and Ni is added to not only the source electrode but also the gate electrode, so that the process can be NiSi salicide process. In order to reduce the resistance, it is effective to make the polysilicon into full-silicide.

The drain electrode 12 (see FIG. 5) is formed on the back surface of the N type substrate 21. In this manner, the semiconductor device as shown in the conceptual diagram of FIG. 5 is obtained. At this occasion, the back surface electrode requires a conventional electrode configuration. More specifically, for example, when an Ni electrode and the like is used, a high temperature process at a temperature more than 800° C. (800° C. to 1600° C.) is required. However, in the semiconductor device according to the embodiment, the SiC/insulating film interface is so rigid that no problem is caused even when the back surface electrode forming process is performed at 1600° C.

In the present embodiment, when the SiC/gate insulating film interface is generated, the SiC surface is nitrogen-terminated in advance. As a result, (1) the interface state was sufficiently low (in the order of $1\times10^9/cm^2$), (2) the interface roughness was reduced (in TEM image, the entire channel region was planarized into an order of 1 mono layer), and (3) discharge of C into the insulating film was prevented (the carbon concentration in the insulating film was 0.0001 at % or less).

Further, when the nitrogen distribution at the $SiO_2$/SiC interface was examined with SIMS, the half-value width had a peak of about 0.2 nm exactly at the interface, and the concentration thereof was $1.0\times10^{15}/cm^2$. It was found that the nitrogen concentration at the side of $SiO_2$ and the nitrogen concentration at the side of the SiC substrate rapidly dropped to $10^{12}/cm^2$ or less.

As a result, the mobility greatly improved to 225 $cm^2$/Vs. It was found that the insulating property greatly improved, so that the gate-leak hardly occurs. Further, the reliability of TDDB (the insulating film was not destroyed at all even when a high electric field in an order of MV/cm was applied for several hours at a high temperature of 300° C.) and BTI (the threshold value hardly shifts during the operation) has greatly improved.

First Modification

Figure 11:
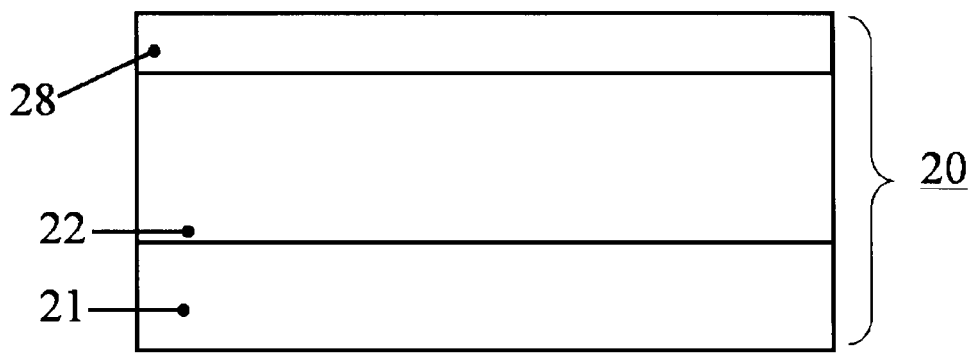
FIG. 11 is a conceptual diagram illustrating the manufacturing process of the semiconductor device according to a first modification.

Subsequently, as shown in the conceptual diagram of FIG. 11, a P type third semiconductor layer 28, which is a P+ type, is grown epitaxially. The thickness is, for example, 0.6 μm, the concentration of 0.4 μm at the side of the substrate is, for example, $4\times10^{17}/cm^3$, and the concentration of 0.2 μm at the side of the surface is, for example, $1\times10^{16}/cm^3$. The P type impurity uses, for example, aluminum.

Figure 12:
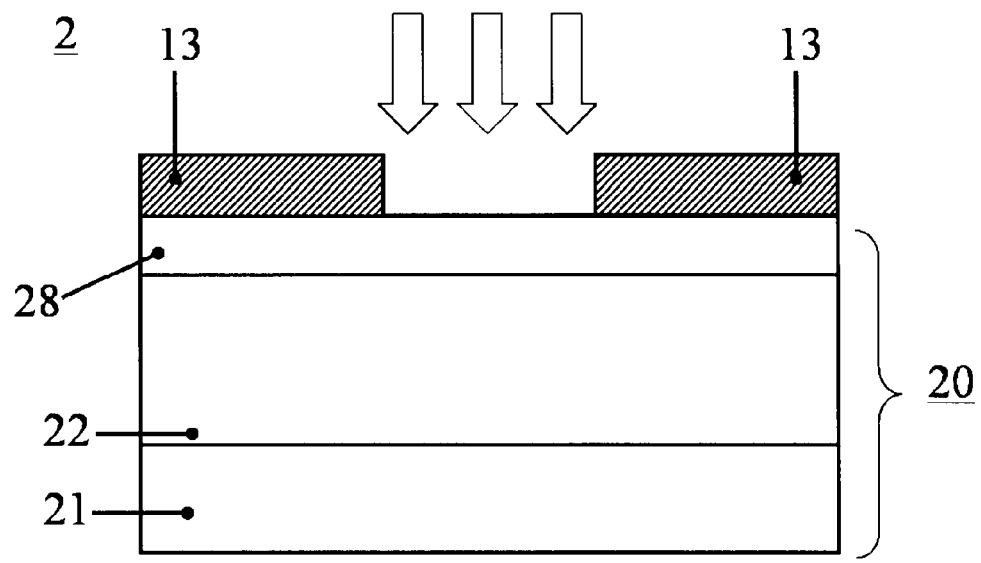
FIG. 12 is a conceptual diagram illustrating the manufacturing process of the semiconductor device according to the first modification.

Subsequently, an ion injection mask 13 is formed as shown in the conceptual diagram of FIG. 12. For example, the polysilicon film is grown, and a predetermined resist mask process is performed. Thereafter, the polysilicon film is patterned. At this occasion, the etching condition of polysilicon is, for example, a reactive ion etching with a strong anisotropic condition. Since the etching process is anisotropic, the mask is patterned into a rectangle. By using this ion injection mask, nitrogen is ion-injected, and the P+ epilayer is converted into N type to make an fourth N type semiconductor region 29, which is connected to an N-epilayer thereunder. The region of the third semiconductor layer 28 that is not converted into the N type due to the mask are adopted as the P type first semiconductor regions 23.

Figure 13:
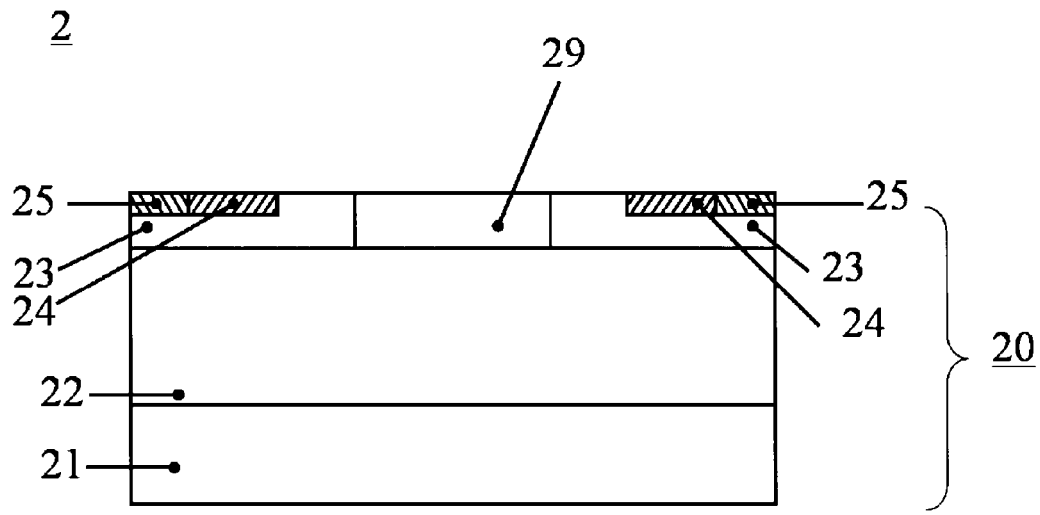
FIG. 13 is a conceptual diagram illustrating the manufacturing process of the semiconductor device according to the first modification.

Subsequently, as shown in FIG. 13, N and Al are respectively introduced by ion injection into the second semiconductor regions 24 and the third semiconductor regions 25 by using the mask and ion injection process.

The nitrogen termination processing is performed on the surface to make a MOS structure.

When nitrogen distribution at the $SiO_2$/SiC interface was examined with SIMS, the nitrogen distribution was the same as that of the first embodiment.

Figure 14:
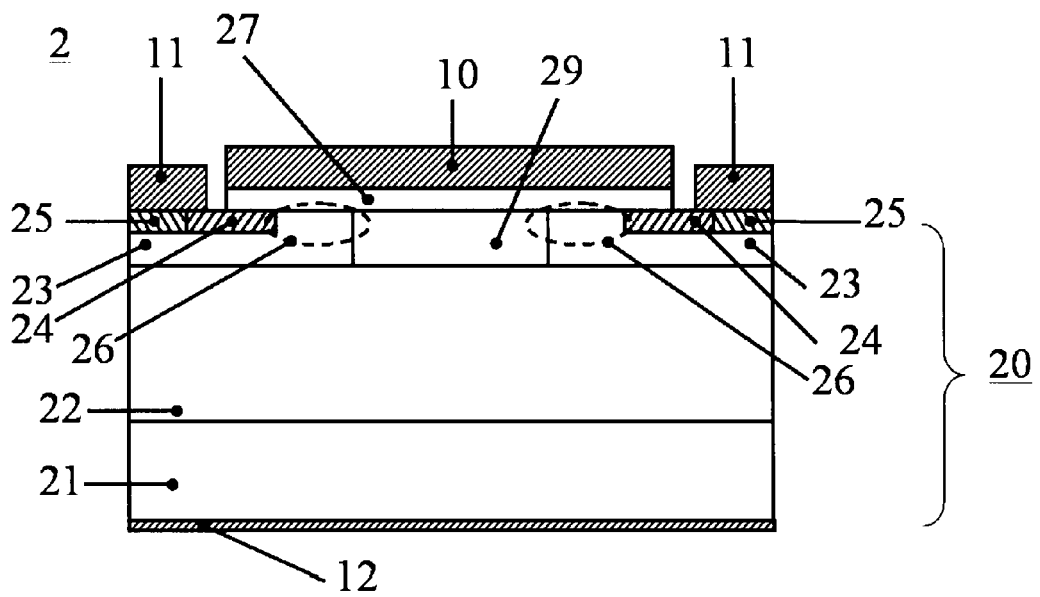
FIG. 14 is a conceptual diagram illustrating manufacturing of the semiconductor device according to the first modification.

Finally, after the gate oxidization and the gate electrode are formed, a predetermined electrode wiring step is performed, and then, the semiconductor device as shown in FIG. 14 is completed. In the modification according to the present embodiment, it is not necessary to inject ion into the MOS channel region 26. Therefore, there is an advantage in that forward characteristic degradation caused by ion injection can be prevented.

Second Modification

The second modification is the same as the first embodiment except that the surface treatment of the SiC substrate is performed by using excited P obtained by plasma-exciting $PH_3$ (compound) instead of the excited N.

The semiconductor device according to the present embodiment can also achieve a highly stable replacing type termination structure. The characteristics of the mobility are better than those in the case of the nitrogen substitution, and the mobility has reached 250 $cm^2/Vs$. One of the reasons is as follows. When the termination is replaced with P, the interface does not become as rough as that of the termination processing using nitrogen, and carbon-derived fixed charge is less likely to be generated in the gate insulating film.

Further, when P distribution at the $SiO_2$/SiC interface was examined with SIMS, the half-value width had a peak of about 0.2 nm exactly at the interface, and the concentration thereof was $1.9 \times 10^{15}/cm^2$. It was found that the P concentration at the side of $SiO_2$ rapidly dropped to $10^{12}/cm^2$ or less.

Third Modification

The third modification is the same as the first embodiment except that the surface treatment of the SiC substrate is performed by using excited As obtained by plasma-exciting AsH3 (compound) instead of the excited N.

The semiconductor device according to the present embodiment can also achieve a highly stable replacing type termination structure. The mobility reached 200 $cm^2/Vs$ which is about the same as the nitrogen substitution.

Further, when As distribution at the $SiO_2$/SiC interface was examined with SIMS, the half-value width had a peak of about 0.2 nm exactly at the interface, and the concentration thereof was $1.0 \times 10^{15}/cm^2$. It was found that the As concentration at the side of $SiO_2$ and the As concentration at the side of the SiC substrate rapidly dropped to $10^{12}/cm^2$ or less.

Fourth Modification

The fourth modification is the same as the first embodiment and the second and third modifications except that, in the termination processing, the processing temperature is set to 100° C., the plasma-excited N (or the plasma-excited P, the plasma-excited As) partial pressure is set to 1.0 Torr, the surface treatment time is set to 300 seconds, and much Ne is introduced to make the total pressure 20 Torr. When the temperature and the total pressure of the termination processing are increased, the SiC substrate processing surface can also be etched, and the processing surface is planarized. When the processing surface is planarized, the surface roughness is further reduced, and the mobility can be increased to 300 $cm^2/Vs$ or more. In the plasma-excited N, it is 320 $cm^2/Vs$. In the plasma-excited P, it is 350 $cm^2/Vs$. In the plasma-excited N, it is 300 $cm^2/Vs$. When nitrogen distribution at the $SiO_2$/SiC interface was examined with SIMS, the nitrogen distribution was the same as the first embodiment.

Fifth Modification

The fifth modification is the same as the first embodiment and the second to fourth modifications except that the plane orientation of SiC to be terminated is (000-1) plane (C plane). When the C plane is terminated, C in the outermost surface can be terminated with a substitution element. The C plane terminated with nitrogen provides more stable termination structure than the Si plane terminated with nitrogen, and on the C plane terminated with nitrogen, the binding energy of the termination is 12 eV.

Originally, the mobility in the C plane can be higher than that in the Si plane. Accordingly, the following mobility can be obtained. In the plasma-excited N, the mobility is 300 $cm^2/Vs$. In the plasma-excited P, the mobility is 275 $cm^2/Vs$. In the plasma-excited As, the mobility is 220 $cm^2/Vs$. When process capable of further planarization is used, the following mobility can be achieved. In the plasma-excited N, the mobility reaches 400 $cm^2/Vs$. In the plasma-excited P, the mobility reaches 375 $cm^2/Vs$. In the plasma-excited As, the mobility reaches 320 $cm^2/Vs$. When substitution element distribution at the $SiO_2$/SiC interface was examined with SIMS, the substitution element distribution was the same as those in the first embodiment and the second to fourth embodiments.

Sixth Modification

The sixth modification is the same as the first embodiment except that the plane orientation of SiC to be terminated is (11-20) plane (A plane), and instead of the excited N, $NH_3$ (compound) and $PH_3$ (compound) are used with a ratio of 1:1 so that each of the partial pressures thereof is 1.0 Torr. When the A plane is terminated, Si and C in the outermost surface can be terminated with substitution elements. In this case, the binding energy of the termination is 10 eV. At this occasion, the mobility of 270 $cm^2/Vs$ can be obtained. When process capable of further planarization is used, the mobility reaches 370 $cm^2/Vs$. When substitution element distribution at the $SiO_2$/SiC interface was examined with SIMS, the substitution element distribution was the same as that of the first embodiment.

Second Embodiment

The second embodiment is the same process as that of the first embodiment, but in the second embodiment, the substrate is P type, so that an IGBT (Insulated Gate Bipolar Transistor) can be made. The process may be the same as that for the DiMOSFET according to the first embodiment.

In this case, the portion serving as the source electrode 11 in the DiMOSFET of the first embodiment becomes an emitter electrode 33, and the portion serving as the drain electrode 12 therein becomes a collector electrode 34.

Figure 15:
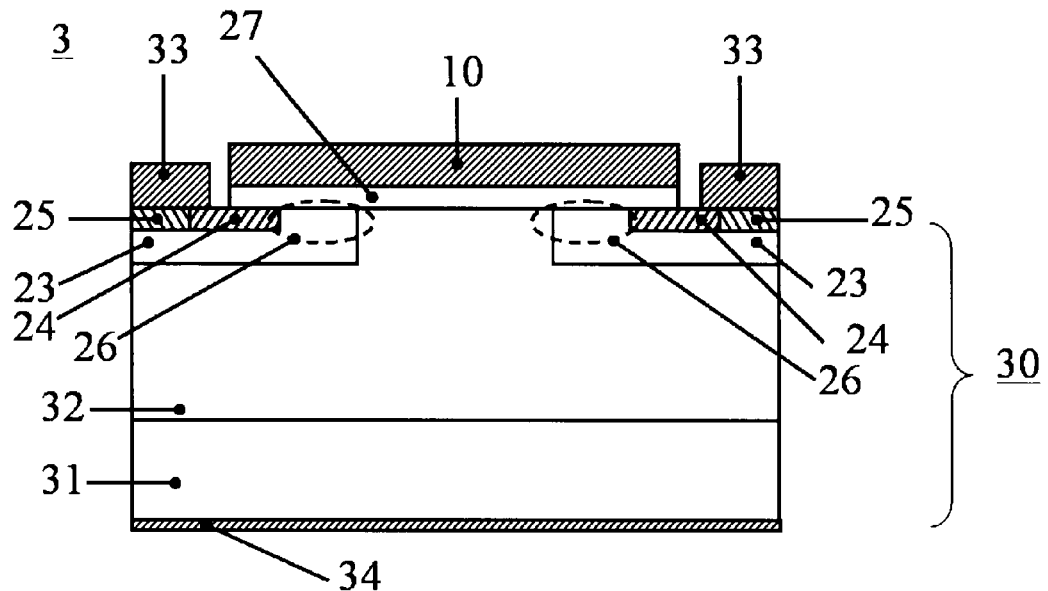
FIG. 15 is a conceptual diagram illustrating manufacturing of a semiconductor device according to a second modification.

FIG. 15 is a cross sectional view illustrating a high-breakdown voltage semiconductor device according to the second embodiment. The second embodiment is different from the first embodiment in that an N type first semiconductor layer 32 is epitaxially grown on a P type substrate 31, which is a P+ type. The P type substrate 31 includes Al as P type impurity, and the concentration thereof is, for example, $6 \times 10^{17}/cm^3$. The thickness is, for example, 300 μm. The thickness of the substrate may be adjusted by CMP and the like. The first semiconductor layer 32 includes nitrogen as N type impurity, and the concentration thereof is, for example, $5 \times 10^{15}/cm^3$. The thickness is, for example, 10 μm.

As described above, in the second embodiment, high performance IGBT could be obtained. Since the operation is bipolar operation, conductivity modulation occurs, and the ON-resistance is reduced. As a result, electric conduction performance can be greatly improved as compared with the DiMOSFET according to the first embodiment.

Seventh Modification

Figure 16:
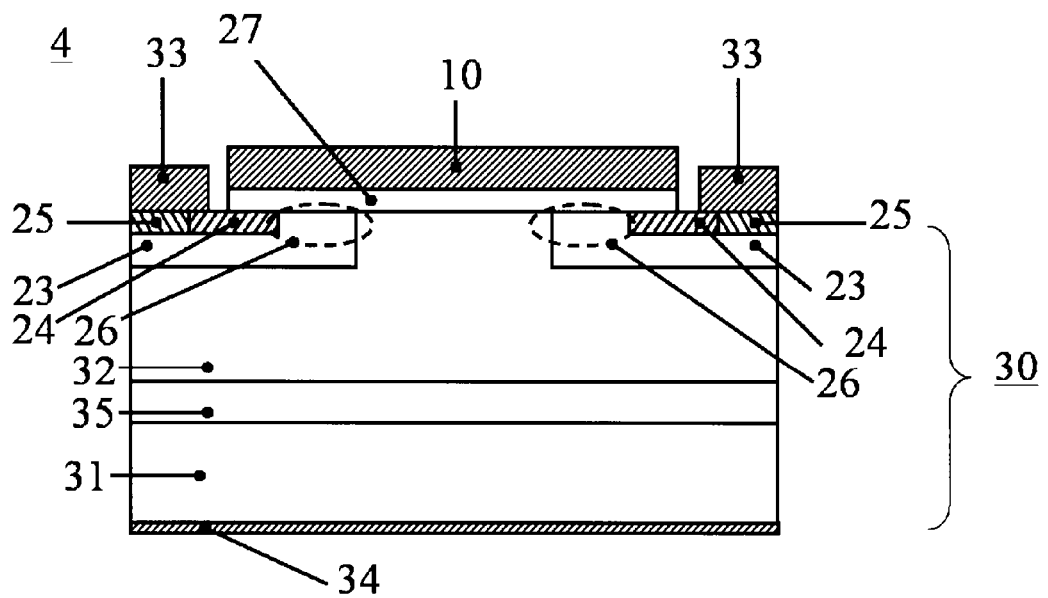
FIG. 16 is a conceptual diagram illustrating manufacturing of a semiconductor device according to a seventh modification.

FIG. 16 is a conceptual diagram illustrating a semiconductor device according to the seventh modification. The seventh modification is the same as the second embodiment except that, before the first semiconductor layer is epitaxially grown on the SiC substrate, an N type second semiconductor layer 35, which is a N+ type, is epitaxially grown on the SiC substrate, and the first semiconductor layer 32 is epitaxially grown on the second semiconductor layer 35. For example, the second semiconductor layer 35 is set to 1 µm.

The second semiconductor layer 35 includes nitrogen as N type impurity, and the concentration thereof is, for example, $5 \times 10^{16}/cm^3$. When the second semiconductor layer 35 is introduced, the IGBT can be switched on and off swiftly. Further, leak can be reduced in the OFF state, and this plays a great role in decreasing the power consumption during the fast operation of the IGBT.

When the substitution element distribution at the $SiO_2$/SiC interface was examined with SIMS, the substitution element distribution was the same as that of the first embodiment.

Methods for manufacturing a semiconductor device of an embodiment are described as follows.

A method for manufacturing a semiconductor device, wherein the SiC substrate is processed in an atmosphere containing a gas obtained by exciting a compound containing one or more elements selected from nitrogen, phosphorus, and arsenic, a gate insulating film is formed on a surface of the processed SiC substrate, an oxygen concentration in the atmosphere is 0.001 ppm or less, a total pressure of the atmosphere is between 2.0 Torr and 20 Torr inclusive, in the atmosphere, a partial pressure of the excitation gas is between 1/200 and 1/10 with respect to the total pressure, a temperature of the processing is between 0° C. and 200° C. inclusive, and a time of the processing is between 10 seconds and 600 seconds inclusive. In the above method, the compound is at least one selected from N, $N_2$, $HN_3$, $NF_3$, $NCl_3$, P, $P_2$, $PH_3$, $PF_3$, $PCl_3$, As, $As_2$, $AsH_3$, $AsF_3$ and $AsCl_3$.

In the above method, the compound is diluted with at least one selected from Ar, He, Ne, Kr and Xe.

A method for manufacturing a semiconductor device, wherein the SiC substrate is processed in an atmosphere containing a gas obtained by exciting a compound containing one or more elements selected from nitrogen, phosphorus, and arsenic, a gate insulating film is formed on a surface of the processed SiC substrate, an oxygen concentration in the atmosphere is 0.001 ppm or less, a total pressure of the atmosphere is between 10 Torr and 20 Torr inclusive, in the atmosphere, a partial pressure of the excitation gas is between 1/200 and 1/10 with respect to the total pressure, a temperature of the processing is between 100° C. and 200° C. inclusive, and a time of the processing is between 200 seconds and 600 seconds inclusive.

In the above method, the compound is at least one selected from N, $N_2$, $HN_3$, $NF_3$, $NCl_3$, P, $P_2$, $PH_3$, $PF_3$, $PCl_3$, As, $As_2$, $AsH_3$, $AsF_3$ and $AsCl_3$.

In the above method, the compound is diluted with at least one selected from Ar, He, Ne, Kr and Xe.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a SiC substrate; and
   a gate insulating film on the SiC substrate;
   wherein
   an outermost surface of the SiC substrate includes a substitution element which is at least one element selected from the group consisting of a nitrogen atom, a phosphorous atom, and an arsenic atom at an interface between the SiC substrate and the gate insulating film, and
   three bonds of the substitution element are bonded to the SiC substrate at an interface between the SiC substrate and the gate insulating film.

2. The device according to claim 1, wherein a surface density of the substitution element at the interface has a peak value between $1.22 \times 10^{14}/cm^2$ and $2.44 \times 10^{15}/cm^2$ inclusive.

3. The device according to claim 1, wherein a surface density of the substitution element at the interface has a peak value between $0.488 \times 10^{15}/cm^2$ and $1.22 \times 10^{15}/cm^2$ inclusive.

4. The device according to claim 1, wherein a surface density of the substitution element at the interface has a peak, and
   a half-value width of distribution of the peak in a film thickness direction is between 0.05 nm and 1.0 nm inclusive.

5. The device according to claim 4, wherein a half-value width of distribution of the peak in a film thickness direction is between 0.05 nm and 0.25 nm inclusive.

6. The device according to claim 1, wherein an element ratio of the substitution element is 10% or more in the outermost surface of the SiC substrate.

7. The device according to claim 1, wherein an element ratio of the substitution element is 40% or more in the outermost surface of the SiC substrate.

8. The device according to claim 1, wherein an orientation of the SiC substrate at the interface is either (0001) plane, (000-1) plane, or (11-20) plane.

9. The device according to claim 8, wherein an orientation of the SiC substrate at the interface is (11-20) plane, the outermost surface includes nitrogen atom and phosphorous atom, and a ratio of the surface between the amount of nitrogen atom and the amount of phosphorous atom is 1:1.

10. The device according to claim 1, wherein a part of Si, C, or Si and C is replaced with the substitution element in the outermost surface of the SiC substrate.

11. A semiconductor device comprising:
    a SiC substrate that has an outermost layer that has undergone replacing-type termination with at least one substitution element selected from the group consisting of N, P and As, whereby Si or C atoms in the outermost layer have been replaced by the at least one substitution element thus eliminating dangling bonds on Si and C atoms at the outermost surface of the substrate; and a $SiO_2$ gate insulating film on the SiC substrate;

wherein the outermost layer of the SiC substrate interfaces with the $SiO_2$ gate insulating film, and wherein the substitution elements exist just on the interface between the SiC substrate and the $SiO_2$ gate insulating film.

12. The semiconductor device of claim 11, wherein the at least one substitution element is on the outermost surface of the SiC substrate and is bonded to the atoms of the SiC substrate by three bonds.

13. The semiconductor device of claim 11, wherein the at least one substitution element replaces a C or Si atom having a dangling bond on the outermost surface of the SiC substrate.

14. The semiconductor device of claim 11, wherein the surface density of the at least one substitution element ranges from $0.122 \times 10^{15}/cm^2$ to $2.44 \times 10^{15}/cm^2$.

15. The semiconductor device of claim 11, wherein the surface density of the at least one replacement element on the sides of the SiC substrate and on the sides of the SiO2 insulating film does not exceed $1.0 \times 10^{12}/cm^2$.

16. The semiconductor device of claim 11, wherein the surface density of the at least one substitution element has a peak at the interface position and the half-value width of distribution in a film thickness direction at the peak is 1 nm or less.

17. The semiconductor device of claim 11, wherein the surface density of the at least one substitution element has a peak at the interface position and the half-value width of distribution in a film thickness direction at the peak ranges from 0.05 nm to 0.25 nm inclusive.

* * * * *